(12) United States Patent
Sajiki (10) Patent No.: US 10,243,118 B2
(45) Date of Patent: Mar. 26, 2019

(54) METHOD FOR MANUFACTURING LIGHT EMITTING DEVICE

(71) Applicant: NICHIA CORPORATION, Anan-shi (JP)

(72) Inventor: Shigeki Sajiki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/844,625

(22) Filed: Dec. 18, 2017

(65) Prior Publication Data

US 2018/0175258 A1 Jun. 21, 2018

(30) Foreign Application Priority Data

Dec. 20, 2016 (JP) .................... 2016-246606

(51) Int. Cl.
| | |
|---|---|
| *H01L 33/54* | (2010.01) |
| *H01L 33/00* | (2010.01) |
| *H01L 33/32* | (2010.01) |
| *H01L 33/50* | (2010.01) |

(52) U.S. Cl.
CPC ............ *H01L 33/54* (2013.01); *H01L 33/007* (2013.01); *H01L 33/32* (2013.01); *H01L 33/507* (2013.01)

(58) Field of Classification Search
None
See application file for complete search history.

(56) References Cited

U.S. PATENT DOCUMENTS

| | | | |
|---|---|---|---|
| 2013/0183777 A1* | 7/2013 | Lim | .................. H01L 33/505 438/27 |
| 2015/0137164 A1 | 5/2015 | Ichikawa | |
| 2015/0357536 A1 | 12/2015 | Ooyabu et al. | |
| 2016/0133809 A1 | 5/2016 | Kuramoto | |
| 2018/0182936 A1* | 6/2018 | Sajiki | .................. H01L 33/54 |

FOREIGN PATENT DOCUMENTS

| | | |
|---|---|---|
| JP | 2012-222315 | 11/2012 |
| JP | 2013-140894 | 7/2013 |
| JP | 2015-097235 | 5/2015 |
| JP | 2016-092110 | 5/2016 |
| JP | 2016-092276 | 5/2016 |
| JP | 2016-115729 | 6/2016 |

* cited by examiner

*Primary Examiner* — Angel Roman (74) *Attorney, Agent, or Firm* — Mori & Ward, LLP (57) ABSTRACT

A method for manufacturing a light emitting device, includes providing a light emitting element including an electrode-formed surface, a substrate surface opposite to the electrode-formed surface, and a light emitting surface connecting the electrode-formed surface and the substrate surface. A bottom mold including a mounting surface having a protrusion and mold recesses provided on both sides of the protrusion to define the protrusion is provided. The light emitting element is mounted on the protrusion such that the light emitting surface faces the protrusion. A covering material is provided on the mounting surface of the bottom mold to fill the mold recesses and to cover an entirety of the light emitting element except for the light emitting surface. The bottom mold with the protrusion is removed to provide a recess in the covering material. A light-transmissive material is provided in the recess of the covering material.

5 Claims, 12 Drawing Sheets

METHOD FOR MANUFACTURING LIGHT EMITTING DEVICE

CROSS-REFERENCE TO RELATED APPLICATIONS

The present application claims priority under 35 U.S.C. § 119 to Japanese Patent Application No. 2016-246606, filed Dec. 20, 2016. The contents of this application are incorporated herein by reference in their entirety.

BACKGROUND OF THE INVENTION

Field of the Invention

The present disclosure relates to a method for manufacturing a light emitting device.

Discussion of the Background

A light emitting device has been known in which, instead of being provided with a housing that houses a light emitting element, a side surface of a light emitting element is covered with a reflective member (e.g., Japanese Unexamined Patent Application Publication No. 2015-97235). In this light emitting device, a wavelength conversion portion is formed on a plurality of light emitting elements, and a light emitting portion is a side surface obtained by cutting the wavelength conversion portion.

SUMMARY OF THE INVENTION

According to one aspect of the present invention, a method for manufacturing a light emitting device, includes providing a light emitting element including an electrode-formed surface on which an electrode of the light emitting element is provided, a substrate surface opposite to the electrode-formed surface, and a light emitting surface connecting the electrode-formed surface and the substrate surface. A bottom mold including a mounting surface having a protrusion and mold recesses provided on both sides of the protrusion to define the protrusion is provided. The light emitting element is mounted on the protrusion such that the light emitting surface faces the protrusion. A covering material is provided on the mounting surface of the bottom mold to fill the mold recesses and to cover an entirety of the light emitting element except for the light emitting surface. The bottom mold with the protrusion is removed to provide a recess in the covering material, the light emitting surface constituting a bottom of the recess. A light-transmissive material is provided in the recess of the covering material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Hereinafter, embodiments of the present invention are described in detail with reference to drawings. In the following description, terms (e.g., "up," "down," "right," "left," and other terms including these terms) are used that indicate a specific direction or position as necessary. The use of these terms is for easy understanding of the invention for which the drawings are referred to, and the meaning of the terms is not to limit a technical scope of the present invention. Parts having the identical symbol appearing in a plurality of drawings represent the identical part or member. As regards a resin member such as a covering member (a covering material), a light-transmissive member (a light-transmissive material), or a light guiding member (a light guiding material), the same name is used for the member regardless of, for example, whether the member is liquid before being cured or solidified or the member is solid after being cured or solidified. The same name is also used for a member regardless of whether the member is an aggregate that has not been divided into pieces or a piece obtained by dividing an aggregate into pieces.

First Embodiment

Figure 1A:
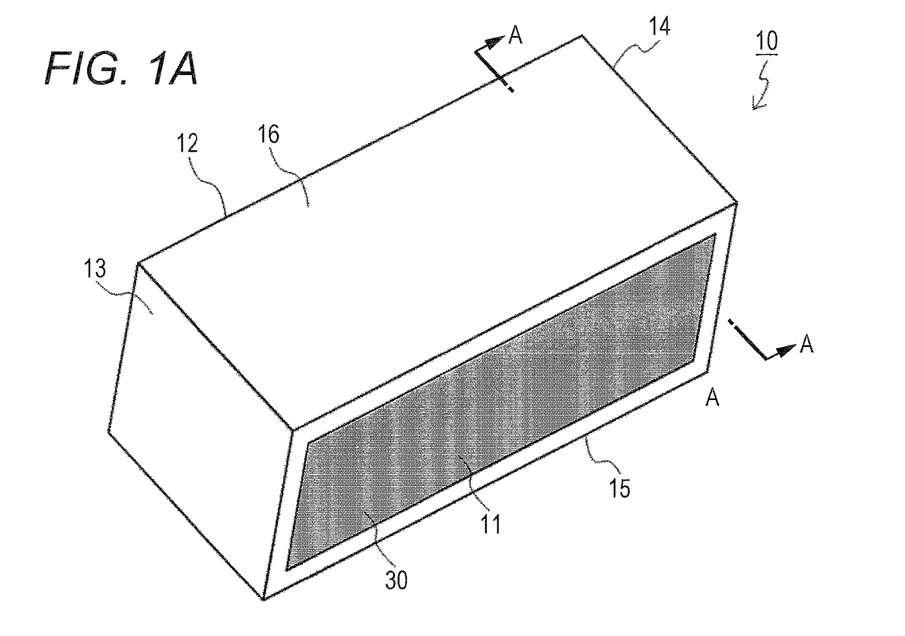
FIG. 1A is a schematic perspective view illustrating one exemplary light emitting device obtained by a method of manufacturing a light emitting device according to an embodiment.
Figure 1B:
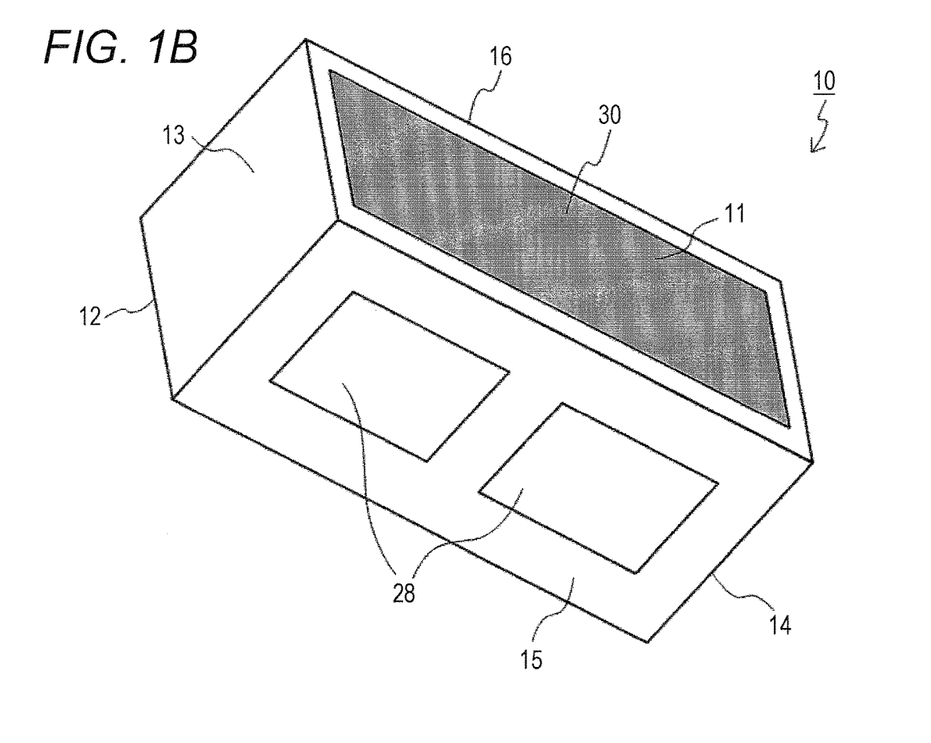
FIG. 1B is a schematic perspective view illustrating the exemplary light emitting device obtained by the method of manufacturing a light emitting device according to the embodiment.
Figure 1C:
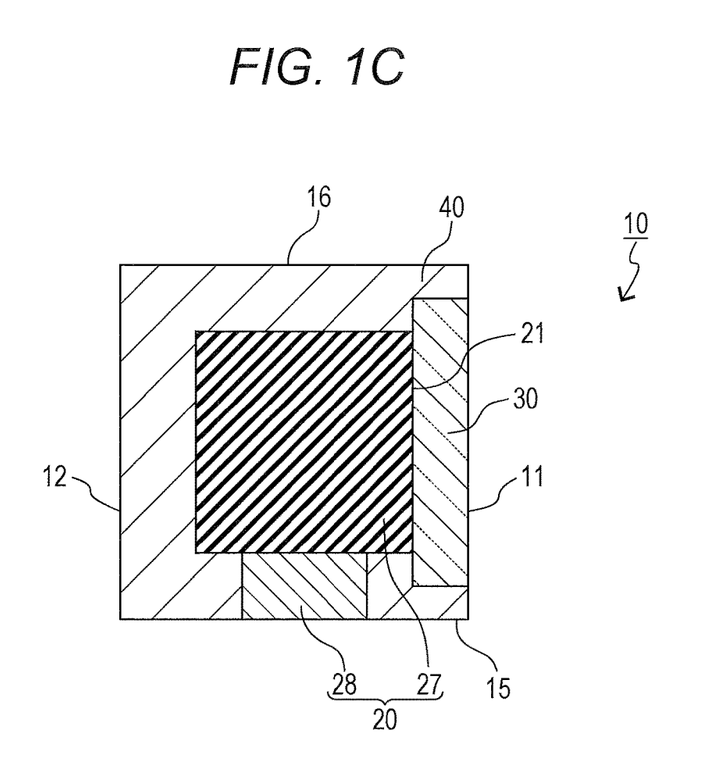
FIG. 1C is a schematic sectional view taken along line A-A of FIG. 1A.

FIGS. 1A to 1C illustrate a light emitting device 10 obtained by a method of manufacturing a light emitting device according to a first embodiment. The light emitting device 10 includes a light emitting element 20, a light-transmissive member 30 (a light-transmissive material 30) provided on a first side surface 21 of the light emitting element 20, and a covering member 40 (a covering material 40) that covers a side surface of the light-transmissive member 30 and the light emitting element 20 except the first side surface 21 thereof. The light-transmissive member 30 functions as a light emitting surface (light extraction surface) of the light emitting device 10.

The method of manufacturing a light emitting device according to the first embodiment is described with reference to FIGS. 2A to 9B. A schematic sectional view (e.g., FIG. 3A) illustrates the light emitting element viewed from an electrode-formed surface 25 side, and a schematic sectional view (e.g., FIG. 3B) illustrates the light emitting element viewed from a third side surface 23 side.

Preparation of Light Emitting Element

Figure 2A:
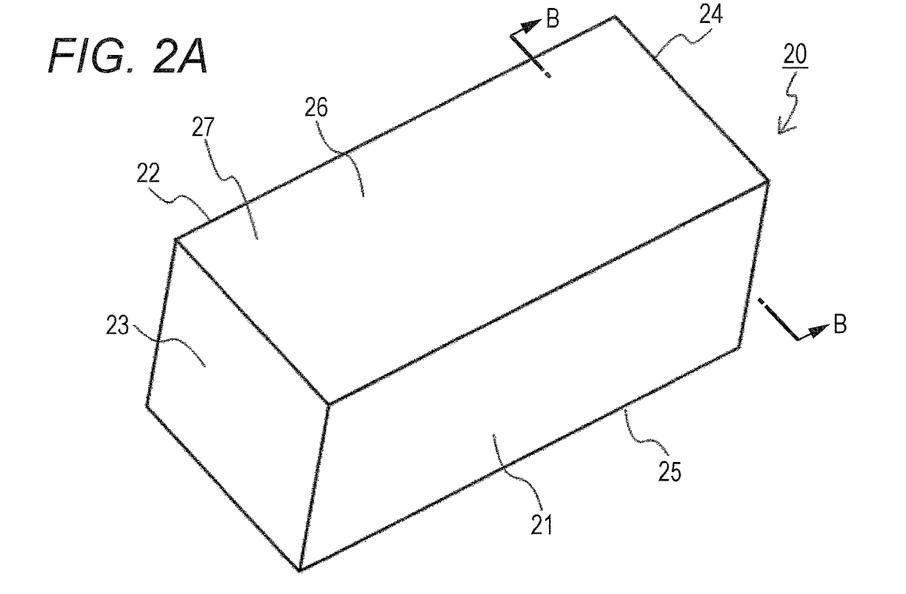
FIG. 2A is a schematic perspective view illustrating one exemplary light emitting element used in the method of manufacturing a light emitting device according to the embodiment.
Figure 2B:
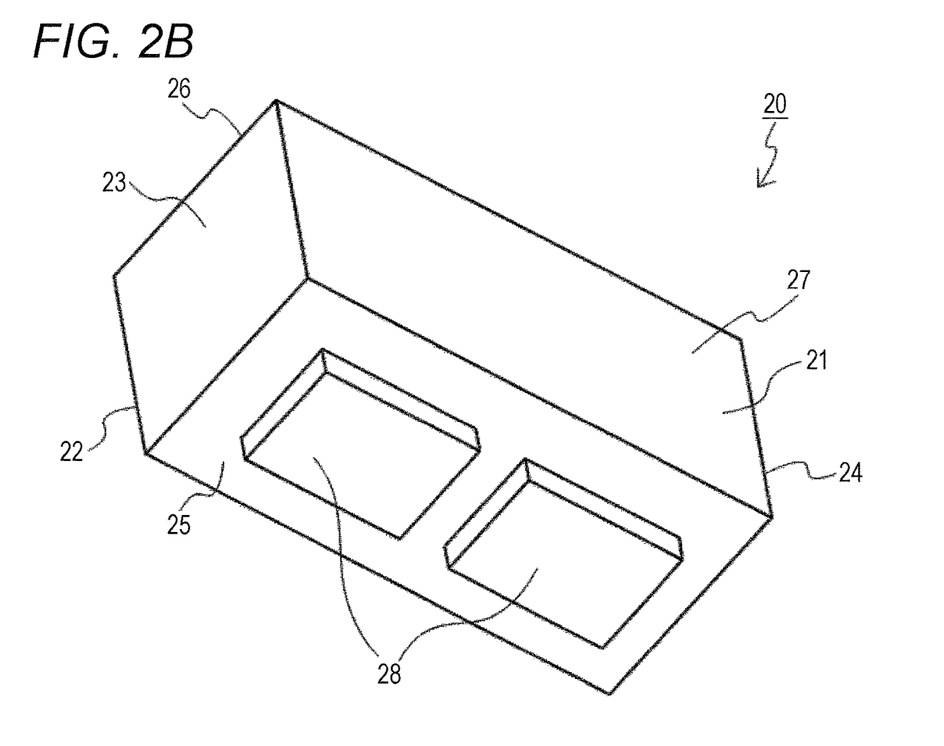
FIG. 2B is a schematic perspective view illustrating the exemplary light emitting element used in the method of manufacturing a light emitting device according to the embodiment.
Figure 2C:
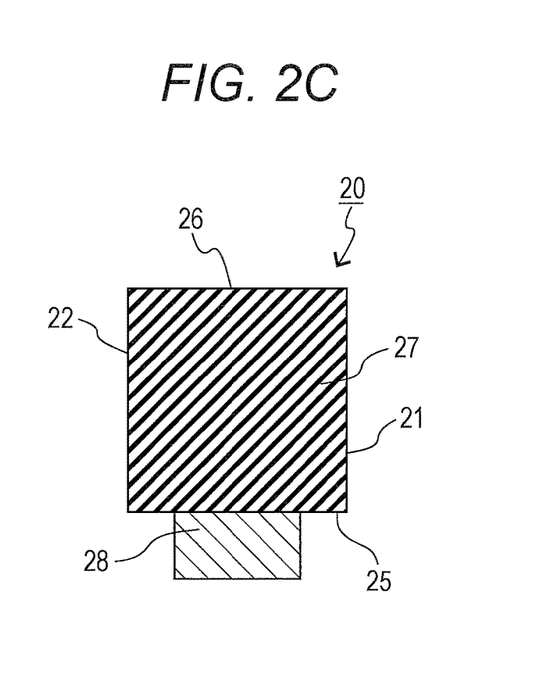
FIG. 2C is a schematic sectional view taken along line B-B of FIG. 2A.

As the light emitting element 20, prepared is a semiconductor light emitting element such as a light emitting diode. As illustrated in FIGS. 2A to 2C, the light emitting element 20 includes a stacked-layer structure body 27 and an electrode 28. The stacked-layer structure body 27 includes a semiconductor layer including a light emitting layer, and an element substrate that is light transmissive. The stacked-layer structure body 27 is a substantially rectangular parallelepiped and has the following six surfaces. One surface is an electrode-formed surface 25 on which the electrode 28 is provided and which includes a surface of the semiconductor layer. A surface opposite from the electrode-formed surface 25 is a substrate surface 26 formed of the element substrate. The stacked-layer structure body includes four side surfaces between the electrode-formed surface 25 and the substrate surface 26. The four side surfaces include the first side surface 21 disposed as the light emitting surface of the light emitting device 10, and a second side surface 22 opposite from the first side surface 21. The four side surfaces further include a third side surface 23 between the first side surface 21 and the second side surface 22 and a fourth side surface 24 opposite from the third side surface 23. Here, exemplified are the electrode-formed surface 25 and the substrate surface 26 which are rectangles each including a long side and a short side. The first side surface 21 and the second side surface 22 are long side surfaces disposed along long sides of the rectangles. The third side surface 23 and the fourth side surface 24 are short side surfaces disposed along short sides of the rectangles.

Preparation of Lower Mold

Figure 3A:
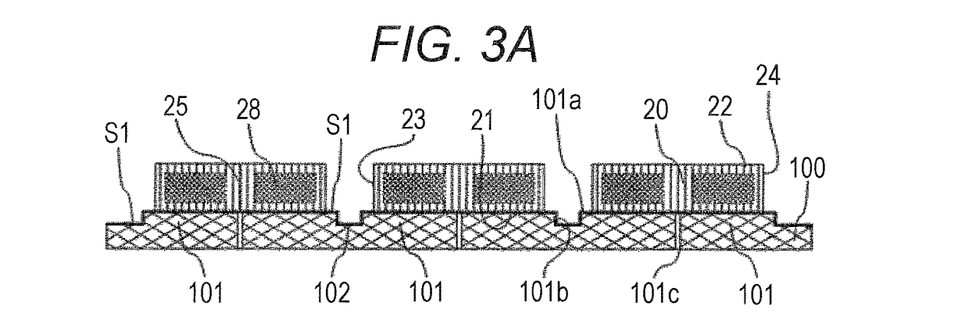
FIG. 3A is a schematic view for describing the method of manufacturing a light emitting device according to the embodiment.
Figure 3B:
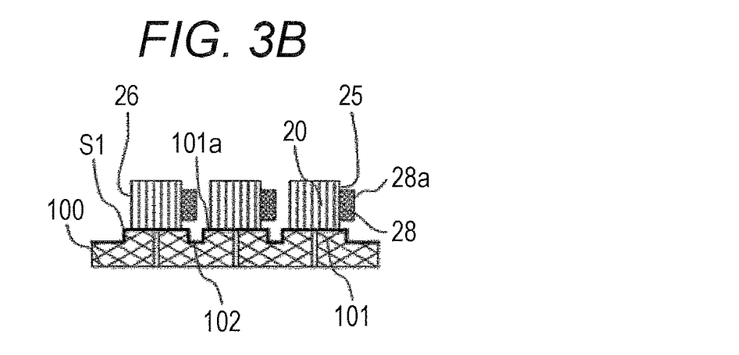
FIG. 3B is a schematic view for describing the method of manufacturing a light emitting device according to the embodiment.

As illustrated in FIGS. 3A and 3B, a lower mold (a bottom mold) 100 is prepared that includes on an upper surface thereof a plurality of protrusion portions 101. Each of the protrusion portions 101 include an upper surface 101a on which the light emitting element 20 is mounted. The upper surface 101a of the protrusion portion 101 preferably includes a flat surface so that the light emitting element 20 can be mounted with the first side surface (the light extraction surface described later) facing the upper surface. The protrusion portion 101 of the lower mold 100 is a part to be a recess portion on which the light-transmissive member 30 is disposed after the lower mold is removed in a following step. Between protrusion portions 101 is provided a plane surface portion 102 positioned lower than the upper surface 101a of the protrusion portions.

The size of the protrusion portion 101 can appropriately be selected. For example, when one light emitting element 20 is mounted on one protrusion portion, the size of the upper surface 101a of the protrusion portion 101 has preferably an area of at least about 50% to 200%, more preferably an area of about 100% to 120% of the area of the first side surface 21 of the light emitting element. All the plurality of protrusion portions provided in one mold preferably have the same shape.

The protrusion portions 101 are preferably disposed so as to have an equal distance between protrusion portions next to each other. In other words, a plurality of plane surface portions 102 preferably have the same width. More preferably, the protrusion portions 101 and the plane surface portions 102 are preferable to be vertically and laterally aligned in a regular manner (aligned in lines).

The upper surface 101a of the protrusion portion 101 of the lower mold 100 can have a circular shape, an elliptical shape, a polygonal shape (e.g., a quadrangular shape and a hexagonal shape), or a shape obtained by combining these shapes. A side surface 101b of the protrusion portion 101 can be a vertical or inclined surface with respect to the upper surface 101a of the protrusion portion 101. That is, when the side surface 101b of the protrusion portion 101 is vertical, the shape of the protrusion portion 101 can be a column such as a circular column or a quadrangular column (e.g., a rectangular column and a hexagonal column). When the side surface 101b of the protrusion portion 101 is an inclined surface, the shape of the protrusion portion 101 can be a frustum such as a frustum of a circular cone or a frustum of a pyramid. When the side surface 101b of the protrusion portion 101 is made inclined, the angle of inclination to the upper surface (horizontal surface) 101a can be about 30 degrees to 90 degrees.

The height of the protrusion portion 101 of the lower mold 100 (the distance between the upper surface 101a of the protrusion portion and the plane surface portion 102) is, for example, preferably about 0.1 mm to 0.5 mm, more preferably about 0.15 mm to 0.25 mm.

The plane surface portion 102 between protrusion portions 101 of the lower mold is preferably a flat surface. The plane surface portion 102 is a surface that forms a surface to be an upper surface of a side wall surrounding lateral side surfaces of the light-transmissive member to be the light emitting surface of the light emitting device 10. Therefore, the plane surface portion is preferably a flat surface. The form of the plane surface potion, however, is not limited to this example, and the plane surface portion 102 of the lower mold 100 may include fine recess portions or protrusion portions.

The lower mold 100 may include a through hole on the upper surface 101a of the protrusion portion 101 and the plane surface portion 102 between protrusion portions 101 (e.g., a through hole 101c illustrated in FIG. 3A). The through hole 101c is a hole for vacuum suction, and for example, can suction a sheet or the light emitting element to hold the sheet or the light emitting element.

For example, in the lower mold 100 including on the upper surface thereof the protrusion portion 101, it is difficult to visually confirm the position of the protrusion portion when mounting on the protrusion portion the light emitting element to which a sheet is attached. Therefore, the sheet is suctioned so as to be along the shape of the protrusion portion 101, which enables easy visual confirmation of the mounting position of the light emitting element (i.e., the upper surface 101a of the protrusion portion 101). In addition, with the sheet suctioned and thus made into a shape along the shape of the upper surface of the lower mold, it is possible to form the covering member into a shape close to the shape of the upper surface of the lower mold 100. For example, a sheet S1 is suctioned to the mold so as to deform the sheet in advance along the protrusion portion 101, so that it is possible to form the covering member having a stable shape. Alternatively, when the covering member is formed, the sheet may be deformed through pressure into a shape along the protrusion portion 101 of the lower mold 100.

Figure 4A:
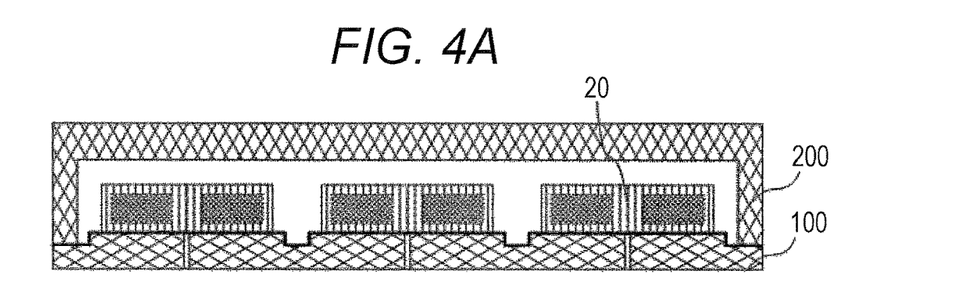
FIG. 4A is a schematic view for describing the method of manufacturing a light emitting device according to the embodiment.
Figure 4B:
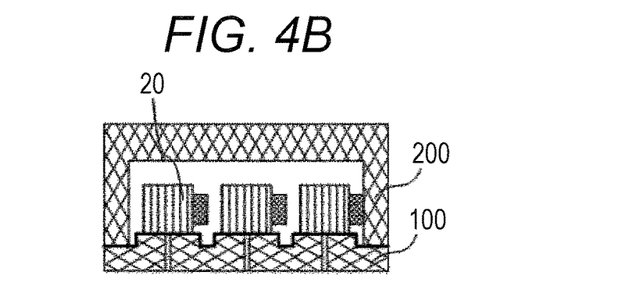
FIG. 4B is a schematic view for describing the method of manufacturing a light emitting device according to the embodiment.

When the covering member is molded, only the lower mold 100 including on the upper surface thereof the protrusion portion can be used as described above. Alternatively, an upper mold (a cover mold) 200 as illustrated in FIGS. 4A and 4B may also be used together. When only the lower mold is used, the formation of the covering member described later can be performed by, for example, potting, printing, or spraying. When the lower mold and the upper mold are used, the formation of the covering member described later can be performed by, for example, transfer molding, compression molding, or injection molding. When the upper mold is used, the upper mold is disposed so that a lower surface of the upper mold faces the upper surface of the lower mold. The lower surface of the upper mold can be made into a flat surface or may be provided with fine protrusions and recesses. The upper mold is preferably disposed on the lower mold in such a manner as to make a gap, into which the covering member can be injected, between the lower surface of the upper mold and the upper surface of the protrusion portion of the lower mold, that is, in such a manner as to make the lower surface of the upper mold spaced apart from the upper surface of the protrusion portion of the lower mold.

Mounting of Light Emitting Element

As illustrated in FIGS. 3A and 3B, the light emitting element 20 is mounted on the upper surface 101a of the protrusion portion 101 of the lower mold 100. In the mounting, the light emitting element 20 is mounted with the first side surface 21 facing the upper surface 101a of the protrusion portion 101. In other words, the light emitting element is mounted with the second side surface 22 upward. The light emitting element 20 mounted can be fixed with an adhesive agent or may be fixed by vacuum suction. When an adhesive agent is used, the adhesive agent may be provided on the upper surface 101a of the protrusion portion 101, or the light emitting element may be mounted on the upper surface 101a of the protrusion portion 101 with the first side surface 21 provided with the adhesive agent. When vacuum suction is used, on the upper surface 101a of the protrusion portion 101 of the lower mold 100 is provided the through hole 101c for vacuum suction, by which the light emitting element mounted on the upper surface can be sucked (suctioned). In the vacuum suction, the diameter of an opening of the through hole 101c is preferably smaller than the area of the light emitting element 20 (the area of the first side surface 21).

In FIGS. 3A and 3B, exemplified is a form in which one light emitting element 20 is mounted on the upper surface 101a of one protrusion portion 101 of the lower mold 100. The form is not limited to this example, and a plurality of light emitting elements 20 may be mounted on one protrusion portion 101. Alternatively, one light emitting element 20 may be mounted across two or more, or a plurality of protrusion portions 101.

The light emitting element 20 is disposed so that the first side surface 21 faces the upper surface 101a of the protrusion portion 101. Therefore, the electrode-formed surface 25 is laterally directed as illustrated in FIGS. 3A and 3B. The light emitting element 20 is mounted on the upper surface 101a of the protrusion portion 101 in such a manner as to dispose a surface 28a of the electrode 28 of the light emitting element 20 outside the upper surface 101a of the protrusion portion 101. In other words, the surface 28a of the electrode 28 of the light emitting element 20 is disposed above the plane surface portion 102 of the lower mold 100.

The light emitting element 20 may directly be mounted on the upper surface 101a of the protrusion portion 101 of the lower mold 100, or may be mounted on the protrusion portion 101 of the lower mold 100 with the sheet S1 interposed between the light emitting element and the protrusion portion as illustrated in, for example, FIG. 3A. For example, the light emitting element 20 obtained by dividing a light emitting element aggregate into pieces is disposed on the sheet S1 that is flat, so that the first side surface 21 faces an upper surface of the sheet S1. Subsequently, the light emitting element 20 together with the sheet S1 can be disposed on the upper surface of the lower mold 100. Alternatively, the light emitting element 20 can be mounted on the sheet S1, which has been disposed in advance so as to cover the protrusion portion 101 of the lower mold 100.

As illustrated in, for example, FIGS. 3A and 3B, the sheet is preferably large enough to cover the upper surface 101a of the plurality of protrusion portions 101 of the lower mold 100, and is preferably stretchable so that the sheet can be deformed along the shape of the protrusion portion 101 of the lower mold 100. More preferably, the sheet is preferably large enough to cover the upper surface including all the protrusion portions 101 of the lower mold 100. Examples of the sheet include a sheet made from silicone, vinyl chloride, a polyolefin, a polyurethane, or a polyimide. The thickness of the sheet is not particularly limited but is preferably thinner than the height of the protrusion portion 101 of the lower mold 100. In addition, the thickness of the sheet is preferably thinner than the height of the light emitting element 20. This thickness is the thickness of an unstretched sheet, and the thickness of the sheet is preferably about 0.06 mm when the sheet is stretched along the shape of the protrusion portion 101 of the lower mold 100. Further, the sheet is preferably adhesive on the upper surface thereof (the surface on which the light emitting element is mounted).

This sheet is left disposed on the upper surface of the lower mold 100 when the covering member is formed in a following step. Therefore, the covering member is not directly contact with the upper surface of the lower mold. After or when the lower mold is removed, the sheet is also removed simultaneously, so that the covering member can be formed that includes a recess portion on a light extraction surface side of the light emitting element. The covering member thus formed with use of the sheet includes a recess portion corresponding to the protrusion portion that is actually larger by the thickness of the sheet than the protrusion portion of the mold.

Covering with Covering Member

A plurality of light emitting elements 20 are mounted on the upper surface 101a of the protrusion portions 101 of the lower mold 100, and then the upper mold 200 is disposed on the lower mold 100 for mold closing as illustrated in FIGS. 4A and 4B.

Figure 5A:
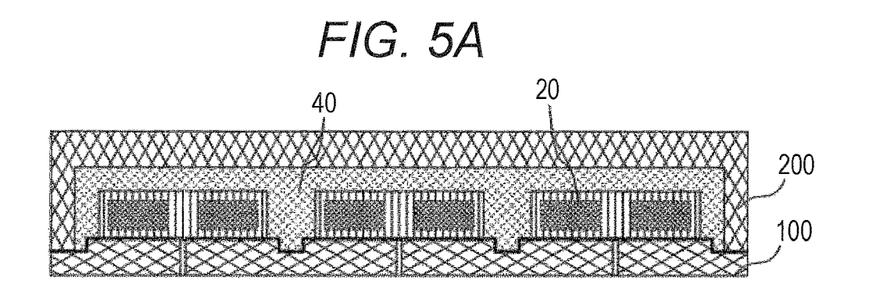
FIG. 5A is a schematic view for describing the method of manufacturing a light emitting device according to the embodiment.
Figure 5B:
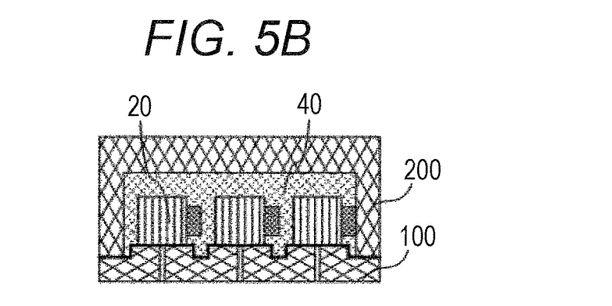
FIG. 5B is a schematic view for describing the method of manufacturing a light emitting device according to the embodiment.

Next, as illustrated in FIGS. 5A and 5B, a space between the lower mold 100 and the upper mold 200 is filled with the covering member 40. The covering member 40 covers the side surface 101b of the protrusion portions 101 and the plane surface portions 102. Depending on the size of the light emitting elements 20, the covering member also covers a part of the upper surface 101a of the protrusion portions 101. Further, the covering member 40 covers the light emitting elements 20 on the protrusion portions 101. In detail, the covering member 40 covers the surfaces except the first side surface 21 of the light emitting elements 20. The surfaces except the first side surface 21 refer to five surfaces including the electrode-formed surface 25, the substrate surface 26, the second side surface 22, the third side surface 23, and the fourth side surface 24. Thus, the plurality of light emitting elements 20 are covered with one covering member 40 to form a light emitting device intermediary body. Here, the light emitting device intermediary body refers to a molded article that includes the light emitting elements 20 and the covering member 40 and is in a stage before the light-transmissive member is formed.

Figure 6A:
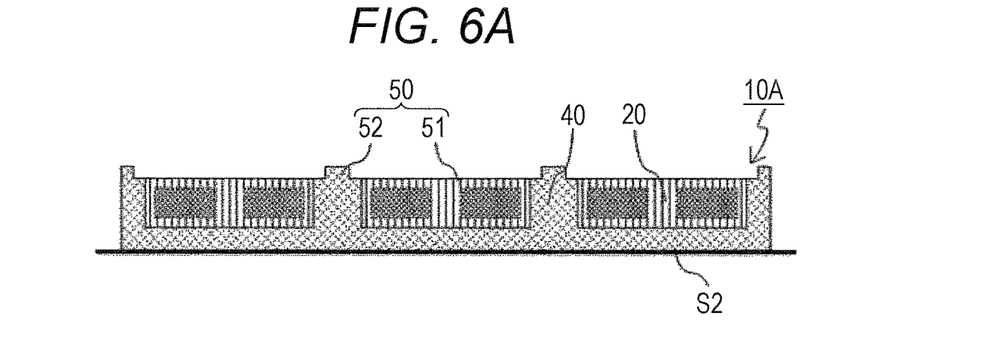
FIG. 6A is a schematic view for describing the method of manufacturing a light emitting device according to the embodiment.
Figure 6B:
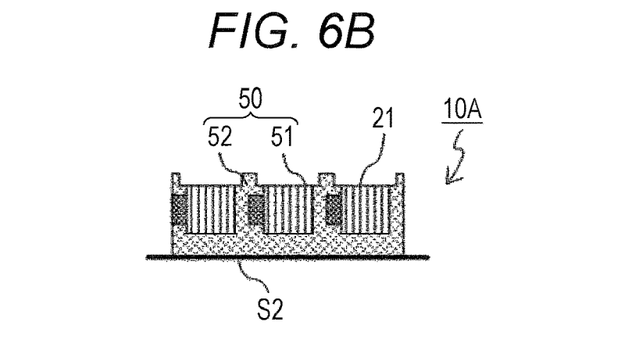
FIG. 6B is a schematic view for describing the method of manufacturing a light emitting device according to the embodiment.
Figure 7A:
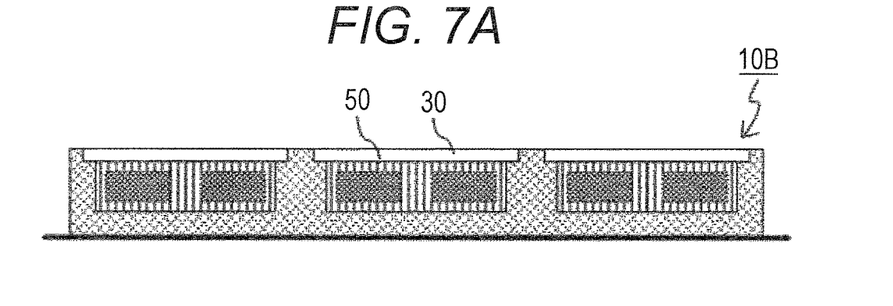
FIG. 7A is a schematic view for describing the method of manufacturing a light emitting device according to the embodiment.
Figure 7B:
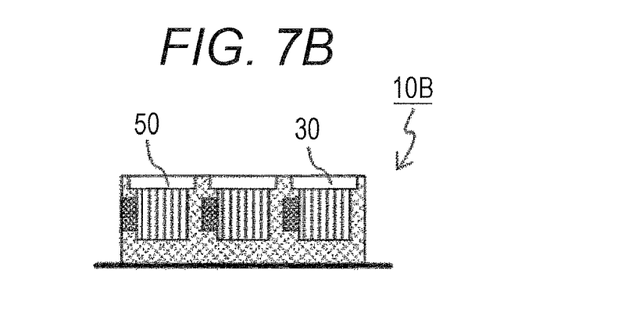
FIG. 7B is a schematic view for describing the method of manufacturing a light emitting device according to the embodiment.

Next, the mold is opened, and a light emitting device intermediary body 10A is removed from the lower mold 100 while having a sheet S2 attached to a surface that is formed by removing the upper mold 200 (a surface in contact with the upper mold 200 in FIGS. 5A and 5B). FIGS. 6A and 6B illustrate the light emitting device intermediary body 10A that is extracted from the lower mold 100 and is flipped vertical. The light emitting device intermediary body 10A formed by the method described above includes a recess portion 50 on an upper side. On a bottom surface 51 of the recess portion 50 is exposed the first side surface 21 of the light emitting element 20. When the area of the first side surface 21 of the light emitting element 20 is smaller than the upper surface 101a of the protrusion portion 101 of the lower mold 100, the covering member 40 is disposed around the first side surface 21 of the light emitting element 20 on the bottom surface 51 of the recess portion 50 of the light emitting device intermediary body 10A. On the other hand, when the area of the first side surface 21 of the light emitting element 20 is larger than or as large as the upper surface 101a of the protrusion portion 101 of the lower mold 100, the bottom surface 51 of the recess portion 50 of the light emitting device intermediary body 10A is only formed of the first side surface 21 of the light emitting element 20.

A side wall 52 of the recess portion 50 of the light emitting device intermediary body 10A includes the covering member 40. The height of the side wall 52 of the recess portion 50 corresponds to the height of the protrusion portion 101 of the lower mold 100. When the covering member 40 is formed with use of the sheet S1, the height of the side wall 52 of the recess portion 50 is a total of the height of the protrusion portion 101 and the thickness of the sheet S1.

Formation of Light-Transmissive Member

Figure 8A:
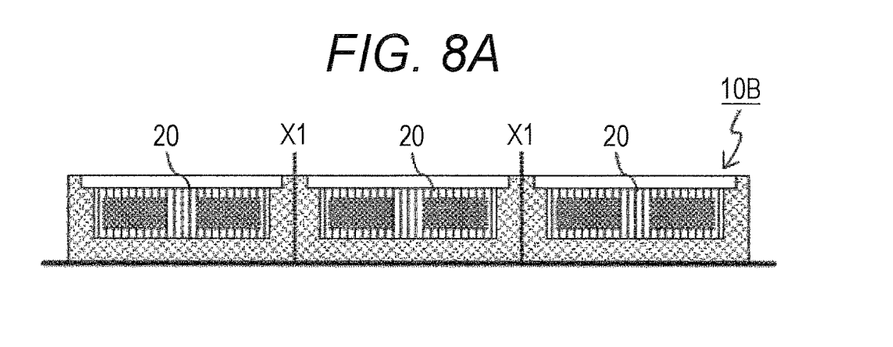
FIG. 8A is a schematic view for describing the method of manufacturing a light emitting device according to the embodiment.
Figure 8B:
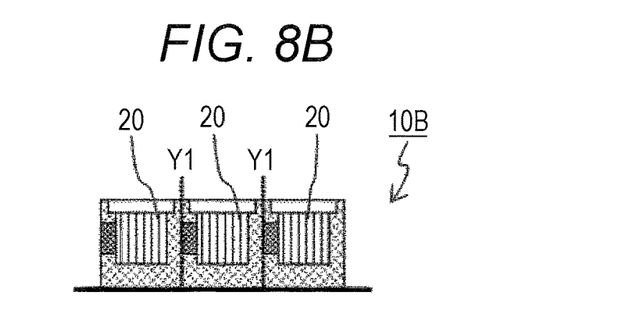
FIG. 8B is a schematic view for describing the method of manufacturing a light emitting device according to the embodiment.

Next, the recess portion 50 of the light emitting device intermediary body 10A is filled with the light-transmissive member 30. The light-transmissive member 30 can be provided by, for example, potting, spray coating, or printing, and particularly, potting is preferable. For example, in an example illustrated in FIGS. 7A and 7B, the light-transmissive member 30 fills the recess portion 50 up to the same height as an upper end of the recess portion. As described above, a light emitting device aggregate 10B can be obtained as illustrated in FIGS. 8A and 8B. The light emitting device aggregate 10B refers to a molded article that has not been divided into pieces.

Cutting of Covering Member

Figure 9A:
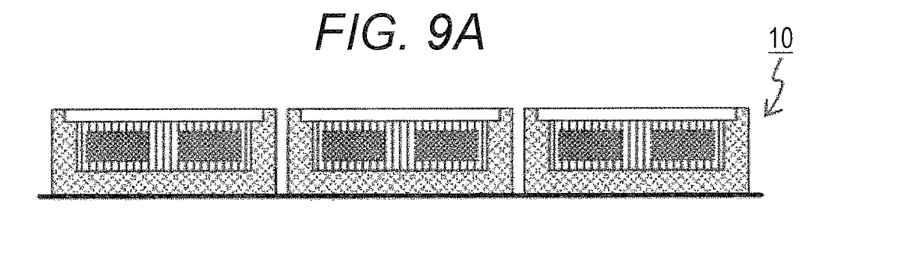
FIG. 9A is a schematic view for describing the method of manufacturing a light emitting device according to the embodiment.
Figure 9B:
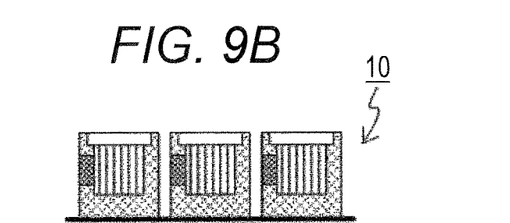
FIG. 9B is a schematic view for describing the method of manufacturing a light emitting device according to the embodiment.

Next, the light emitting device aggregate can be cut along the cutting lines X1 and Y1 between light emitting elements 20 as illustrated in FIGS. 8A and 8B, to give the light emitting device 10 divided, as illustrated in FIGS. 9A and 9B. As illustrated in FIG. 8A, the cutting line X1 is preferably around the center of the covering member 40 between the light emitting elements 20. Alternatively, the cutting line Y1 illustrated in FIG. 8B is around the center of the covering member 40 and cuts the covering member so that the electrode 28 of the light emitting element 20 is exposed.

According to the manufacturing method described above, the light emitting device 10, which is small-sized and has excellent light-extraction efficiency, can be obtained as illustrated in FIGS. 9A and 9B.

Second Embodiment

Figure 10:
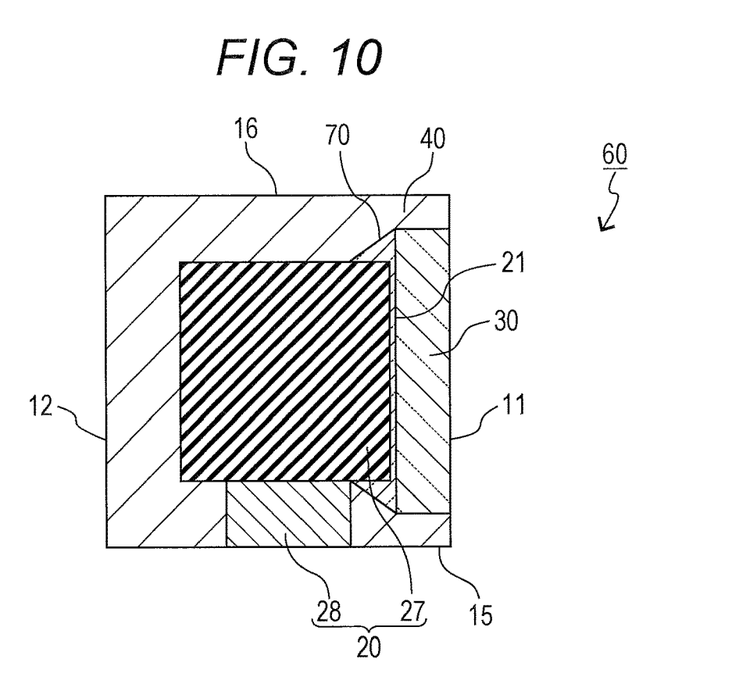
FIG. 10 is a schematic sectional view illustrating one exemplary light emitting device obtained by a method of manufacturing a light emitting device according to an embodiment.

FIGS. 11A to 18B illustrate a method of manufacturing a light emitting device according to a second embodiment. FIG. 10 is a schematic sectional view illustrating a light emitting device 60 obtained by the method of manufacturing a light emitting device according to the second embodiment. The outer appearance of the light emitting device 60 obtained by the method of manufacturing a light emitting device according to the second embodiment is the same as the outer appearance in FIGS. 1A and 1B.

The light emitting device 60 includes a light emitting element 20, a light guiding member 70 (a light guiding material 70) provided so as to be in contact with a first side surface 21, a third side surface 23, a fourth side surface 24, an electrode-formed surface 25, and a substrate surface 26 of the light emitting element 20, a light-transmissive member 30 provided on the light guiding member 70 on the first side surface 21 of the light emitting element 20, and a covering member 40 that covers a side surface of the light guiding member 70. The light-transmissive member 30 functions as a light emitting surface (light extraction surface) of the light emitting device 60. The second embodiment is the same as the first embodiment except that the second embodiment includes the light guiding member 70.

The method of manufacturing a light emitting device according to the second embodiment includes an additional step of forming the light guiding member 70, as well as the same steps as in the method of manufacturing a light emitting device according to the first embodiment. In detail, the same steps as in the first embodiment are preparing a light emitting element, preparing a lower mold, mounting the light emitting element, covering the light emitting element with a covering member, and forming a light-transmissive member. The second embodiment includes an additional step of forming the light guiding member on the lower mold before the step of mounting the light emitting element. In the following description, omitted are the steps of preparing a light emitting element and preparing a lower mold. Also in the steps of forming a covering member and forming a light-transmissive member, the steps are basically the same as in the first embodiment except the points specifically mentioned.

Formation of Light Guiding Member

Figure 11A:
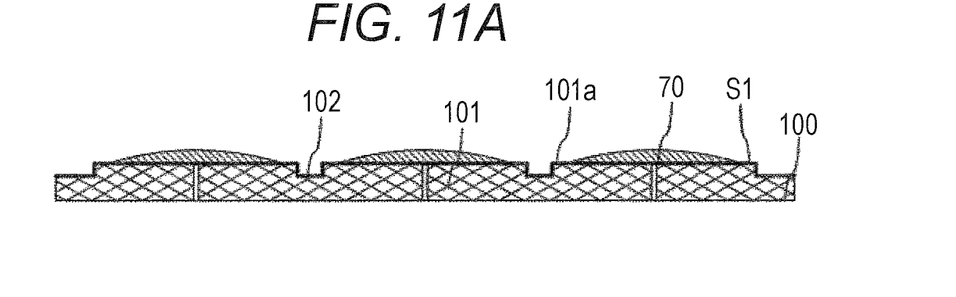
FIG. 11A is a schematic view for describing the method of manufacturing a light emitting device according to the embodiment.
Figure 11B:
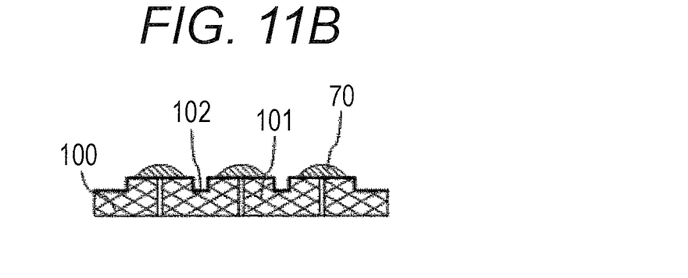
FIG. 11B is a schematic view for describing the method of manufacturing a light emitting device according to the embodiment.

As illustrated in FIGS. 11A and 11B, the light guiding member 70 that is liquid is formed on an upper surface 101a of protrusion portions 101 of a lower mold 100. Here, a case of using a sheet S1 is described. Therefore, the light guiding member 70 that is liquid is, in detail, formed on the sheet S1 on the upper surface 101a of the protrusion portions 101. The light guiding member 70 that is liquid is formed in a separate manner on the upper surface 101a of each of the protrusion portions 101. The light guiding member 70 is not formed on a plane surface portion 102 between protrusion portions 101.

Mounting of Light Emitting Element

Figure 12A:
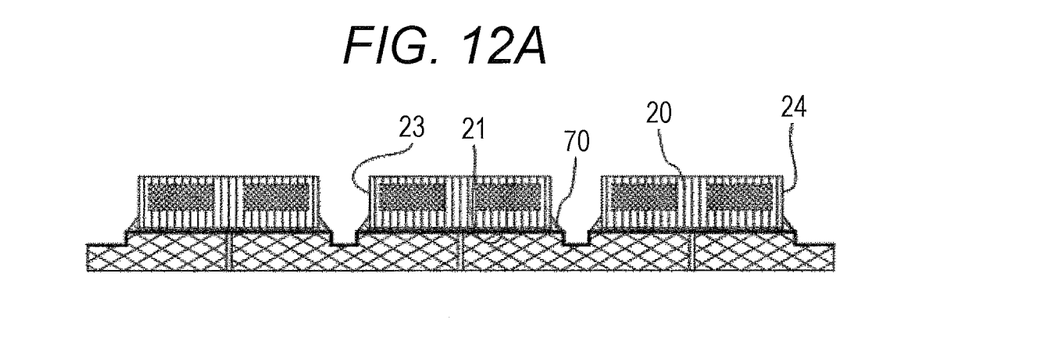
FIG. 12A is a schematic view for describing the method of manufacturing a light emitting device according to the embodiment.
Figure 12B:
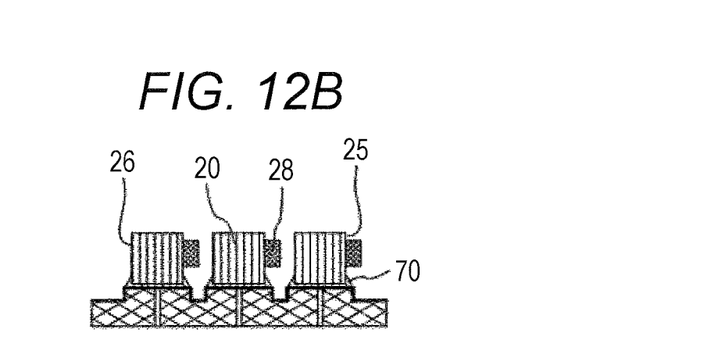
FIG. 12B is a schematic view for describing the method of manufacturing a light emitting device according to the embodiment.

Next, as illustrated in FIGS. 12A and 12B, the light emitting element 20 is mounted on the light guiding member 70 that has not been cured. The light emitting element 20 is only mounted on the light guiding member 70 or pressed after mounted to make the light guiding member 70 come up along the third side surface 23, the fourth side surface 24, the electrode-formed surface 25, and the substrate surface 26 of the light emitting element 20, by the surface tension of the light guiding member. Thus, an outer surface of the light guiding member 70 comes to have a shape that widens downward. The thickness of the light guiding member 70 between the first side surface 21 and the upper surface 101a of the protrusion portion 101 can be, for example, 1 μm to 30 μm, preferably 4 μm to 20 μm, most preferably about 5 μm to 10 μm.

Covering with Covering Member

Figure 13A:
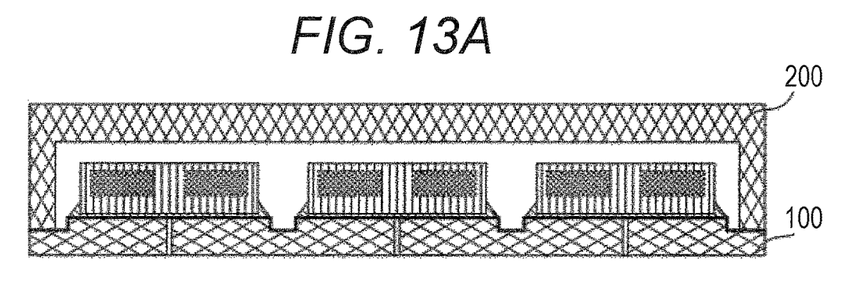
FIG. 13A is a schematic view for describing the method of manufacturing a light emitting device according to the embodiment.
Figure 13B:
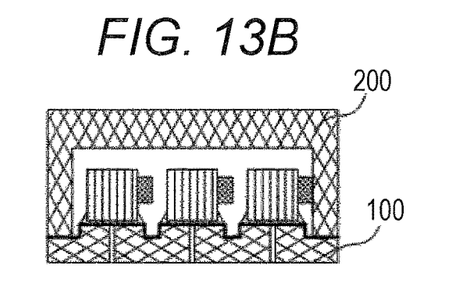
FIG. 13B is a schematic view for describing the method of manufacturing a light emitting device according to the embodiment.

Next, as illustrated in FIGS. 13A and 13B, an upper mold 200 is disposed on the lower mold 100 for mold closing. Subsequently, as illustrated in FIGS. 14A and 14B, a space between the lower mold 100 and the upper mold 200 is filled with the covering member 40.

Figure 14A:
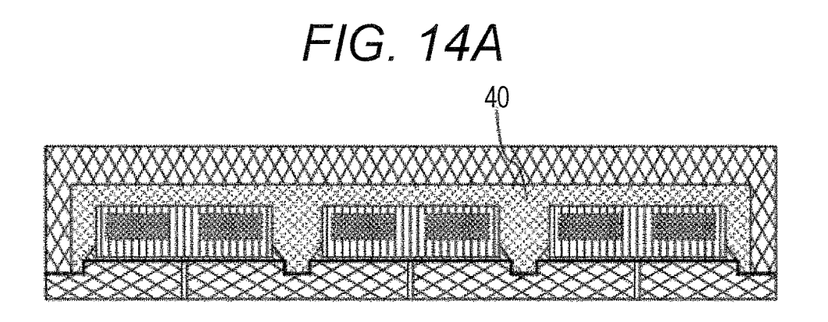
FIG. 14A is a schematic view for describing the method of manufacturing a light emitting device according to the embodiment.
Figure 14B:
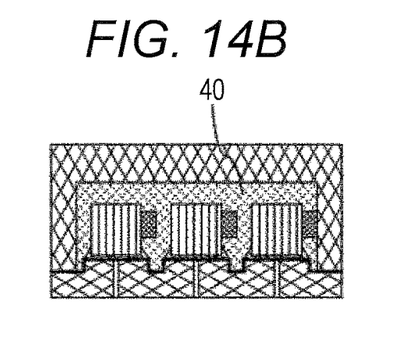
FIG. 14B is a schematic view for describing the method of manufacturing a light emitting device according to the embodiment.
Figure 15A:
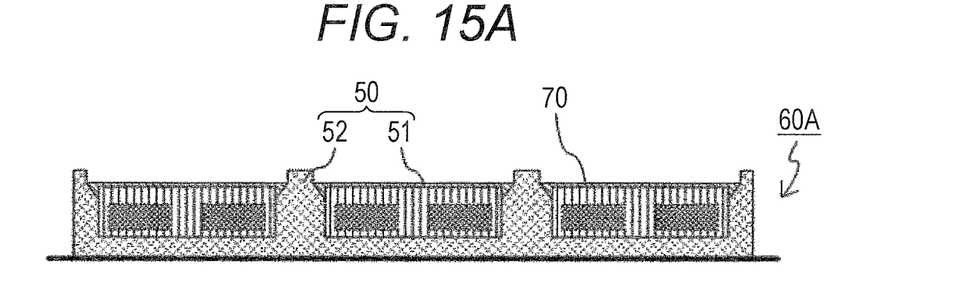
FIG. 15A is a schematic view for describing the method of manufacturing a light emitting device according to the embodiment.
Figure 15B:
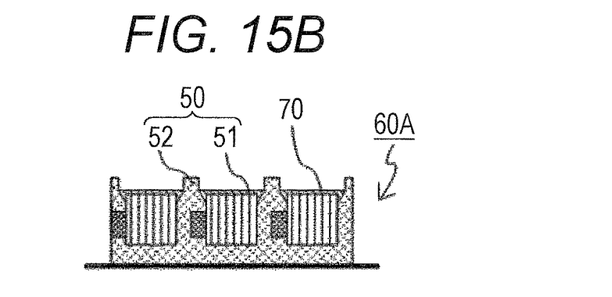
FIG. 15B is a schematic view for describing the method of manufacturing a light emitting device according to the embodiment.

Next, the mold is opened, and a light emitting device intermediary body 60A is removed from the lower mold 100 while having a sheet S2 attached to a surface that is formed by removing the upper mold 200 (a surface in contact with the upper mold 200 in FIGS. 14A and 14B). FIGS. 15A and 15B illustrate the light emitting device intermediary body 60A that is extracted from the lower mold 100 and is flipped vertical. The light emitting device intermediary body 60A formed by the method described above includes a recess portion 50 on an upper side. On a bottom surface 51 of the recess portion 50 is exposed the light guiding member 70.

Formation of Light-Transmissive Member

Figure 16A:
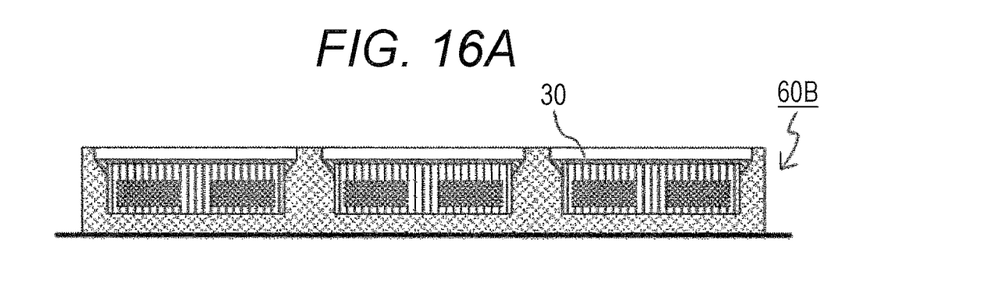
FIG. 16A is a schematic view for describing the method of manufacturing a light emitting device according to the embodiment.
Figure 16B:
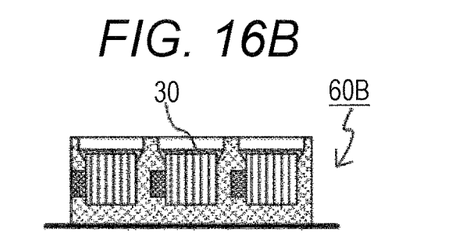
FIG. 16B is a schematic view for describing the method of manufacturing a light emitting device according to the embodiment.

Next, as illustrated in FIGS. 16A and 16B, the recess portion 50 of the light emitting device intermediary body 60A is filled with the light-transmissive member 30 to give a light emitting device aggregate 60B.

Cutting of Covering Member

Figure 17A:
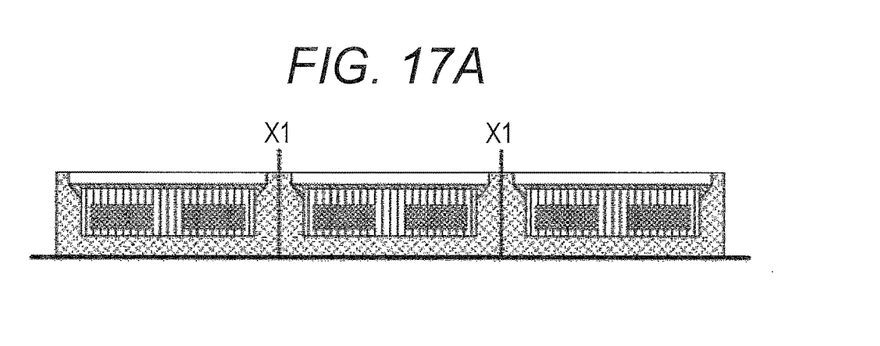
FIG. 17A is a schematic view for describing the method of manufacturing a light emitting device according to the embodiment.
Figure 17B:
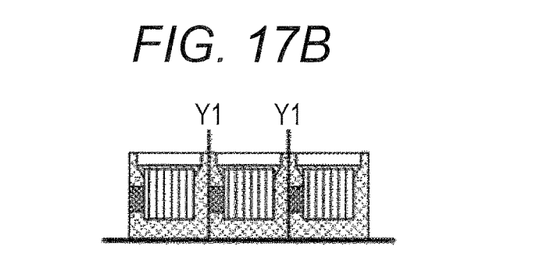
FIG. 17B is a schematic view for describing the method of manufacturing a light emitting device according to the embodiment.
Figure 18A:
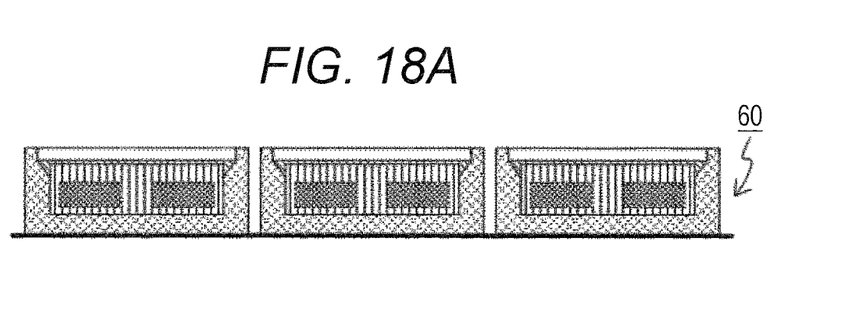
FIG. 18A is a schematic view for describing the method of manufacturing a light emitting device according to the embodiment.
Figure 18B:
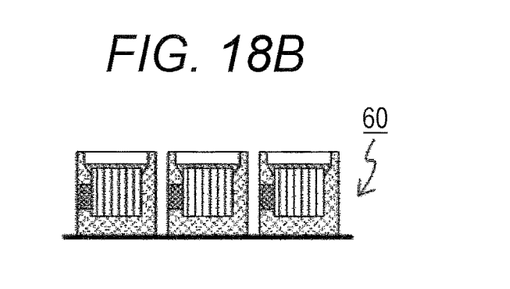
FIG. 18B is a schematic view for describing the method of manufacturing a light emitting device according to the embodiment.

Next, the light emitting device aggregate can be cut along the cutting lines X1 and Y1 between light emitting elements 20 as illustrated in FIGS. 17A and 17B, to give the light emitting device 60 divided, as illustrated in FIGS. 18A and 18B.

Hereinafter, description is made for materials and the like suitable for constituent members of the light emitting devices in the embodiments.

Light Emitting Element

As the light emitting element, there can be used, for example, a semiconductor light emitting element, such as a light emitting diode, that can emit visible light of, for example, blue, green or red color. The semiconductor light emitting element can include a light-transmissive substrate and a semiconductor stacked-layer body formed on the light-transmissive substrate. The semiconductor stacked-layer body includes, on a side opposite from the light-transmissive substrate (on a facing surface) an electrode-formed surface provided with an electrode. The light-transmissive substrate is used as a light extraction surface.

Semiconductor Stacked-Layer Body

The semiconductor stacked-layer body includes a plurality of semiconductor layers. As an example of the semiconductor stacked-layer body, the semiconductor stacked-layer body can include three semiconductor layers, i.e., a first electrically conductive semiconductor layer (e.g., an n-type semiconductor layer), a light emitting layer (active layer), and a second electrically conductive semiconductor layer (e.g., a p-type semiconductor layer). A semiconductor layer capable of emitting ultraviolet light or visible light of blue color to green color can be formed from a semiconductor material such as a group III-V compound semiconductor or a group II-VI compound semiconductor. Specifically, there can be used a nitride-based semiconductor material (e.g., InN, AlN, GaN, InGaN, AlGaN, and InGaAlN) such as $In_XAl_YGa_{1-X-Y}N$ ($0 \leq X$, $0 \leq Y$, $X+Y \leq 1$). As a semiconductor stacked-layer body capable of emitting red light, there can be used, for example, GaAs, GaAlAs, GaP, InGaAs, and InGaAsP.

Element Substrate

The element substrate of the light emitting element is light transmissive. When, for example, the nitride-based semiconductor material described above is used, there can be used, for the element substrate, a light-transmissive insulating material such as sapphire ($Al_2O_3$) or spinel ($MgAl_2O_4$) and a semiconductor material (e.g., a nitride-based semiconductor material) that transmits the light emitted from the semiconductor stacked-layer body. When a semiconductor material such as GaAs is used, there can be exemplified GaAlAs and InGaAs for the element substrate. Here, the light transmissivity refers to a property of being capable of transmitting about 60%, 65%, 70%, or 80% or more of the light output from the light emitting element.

Electrode

A pair of electrodes of the light emitting element is disposed on an identical surface of the semiconductor layer. The pair of electrodes may acceptably have either a single-layer structure or a stacked-layer structure as long as the electrodes are ohmically connected to the above-described first electrically conductive semiconductor layer and second electrically conductive semiconductor layer, respectively, so that the current-voltage characteristics are linear or substantially linear. Such electrodes can be formed of a material and with composition known in this field at any thickness. For example, the thickness of the electrodes is preferably dozens of micrometers to 300 μm. As the electrodes, an electrically good conductor can be used, and metals such as Cu, Au, Ag, and AuSn are suitable, for example.

Light-Transmissive Member

The light-transmissive member is a member that transmits the light from the light emitting element and constitutes the light emitting surface of the light emitting device. As a light-transmissive material, a light-transmissive resin and glass can be used. Particularly, a light-transmissive resin is preferable, and there can be used thermosetting resins such as a silicone resin, a silicone-modified resin, an epoxy resin, and a phenolic resin, and thermoplastic resins such as a polycarbonate resin, an acrylic resin, a methylpentene resin, and a polynorbornene resin. Particularly, a silicone resin is suitable that is excellent in light resistance and heat resistance.

The light-transmissive member may contain, in addition to the light-transmissive material, a fluorescent material as a wavelength conversion member (a wavelength conversion material). Used as the fluorescent material is one that can be excited by the light emitted from the light emitting element. As a fluorescent material that can be excited by a blue light emitting element or an ultraviolet light emitting element, there can be exemplified a cerium-activated yttrium-aluminum-garnet-based fluorescent material (Ce:YAG); a cerium-activated lutetium-aluminum-garnet-based fluorescent material (Ce:LAG); an europium- and/or chromium-activated nitrogen-containing calcium aluminosilicate-based fluorescent material ($CaO-Al_2O_3-SiO_2$); an europium-activated silicate-based fluorescent material (($Sr,Ba)_2SiO_4$); a nitride-based fluorescent materials such as a β-sialon fluorescent material, a CASN-based fluorescent material, and a SCASN-based fluorescent material; a KSF-based fluorescent material ($K_2SiF_6$:Mn); a sulfide-based fluorescent material; and a quantum dot fluorescent material. Combination of these fluorescent materials and a blue light emitting element or an ultraviolet light emitting element enables manufacturing of various color light emitting devices (e.g., a white light emitting device).

The light-transmissive member may further contain various fillers or the like for the purpose of, for example, adjusting viscosity.

Light Guiding Member

The light guiding member is a member interposed between the light emitting element and the light-transmissive member. The light-guiding member can be formed from a light-transmissive material such as a light-transmissive resin or glass. As the light-transmissive resin, particularly preferable are thermosetting light-transmissive resins such as a silicone resin, a silicone-modified resin, an epoxy resin, and a phenolic resin. The light guiding member is in contact with a surface of the light emitting element, so that the light guiding member is likely to be affected by heat generated in the light emitting element that is lighted. The thermosetting resin is excellent in heat resistance and is thus suitable for the light guiding member. The light guiding member preferably has a high light transmissivity. Therefore, it is normally preferable not to add to the light guiding member an additive that reflects, absorbs, or scatters light. In order to impart desirable characteristics, however, it is sometimes preferable to add an additive to the light guiding member. For example, various fillers may be added to adjust the refractive index of the light guiding member or adjust the viscosity of the light guiding member that has not been cured.

Covering Member

The covering member is formed of a light-reflective member that reflects the light from the light emitting element. The covering member is provided so as to cover a side surface of the light-transmissive member. Further, the covering member is preferably provided so as to also cover a side surface of the light emitting element. When the light emitting device includes the light guiding member, the covering member is provided so as to cover the light guiding member.

The covering member is formed from such a material that gives a predetermined relationship with the light-transmissive member, the light guiding member, or the light emitting element in terms of the coefficient of thermal expansion. That is, a material for the covering member is selected so that a difference in the coefficient of thermal expansion between the covering member and the light emitting element $\Delta T_{40}$ is smaller than a difference in the coefficient of thermal expansion between the light-transmissive member and the light emitting element $\Delta T_{30}$. For example, when the light emitting element includes a sapphire light-transmissive substrate and a semiconductor stacked-layer body formed of a GaN-based semiconductor, the coefficient of thermal expansion of the light emitting element is about 5 to $7 \times 10^{-6}$/K. On the other hand, when the light-transmissive member or the light guiding member is formed from a silicone resin, the coefficient of thermal expansion of the light-transmissive member or the light guiding member is 2 to $3 \times 10^{-5}$/K. Accordingly, the covering member can be formed from a material having a smaller coefficient of thermal expansion than the coefficient of thermal expansion of the silicone resin to satisfy a relationship $\Delta T_{40} < \Delta T_{30}$.

When a resin material is used for the covering member, the coefficient of thermal expansion is generally on the order of $10^{-5}$/K, which is one digit greater than the coefficient of thermal expansion of a general light emitting element. Addition of, for example, a filler, to the resin material, however, enables reduction of the coefficient of thermal expansion of the resin material. For example, a filler such as silica can be added to a silicone resin to reduce the coefficient of thermal expansion of the silicone resin to which the filler has not been added.

As the material that can be used for the covering member, particularly preferable are thermosetting light-transmissive resins such as a silicone resin, a silicone-modified resin, an epoxy resin, and a phenolic resin.

The covering member can be formed from a light-reflective resin. The light-reflective resin means a resin material having a reflectivity of 70% or more for the light from the light emitting element. The light having reached the covering member can be reflected and directed toward the light emitting surface of the light emitting device to enhance light extraction efficiency of the light emitting device. Therefore, the embodiments of the present invention can easily give light emitting devices that are compact and have good visibility.

As the light-reflective resin, there can be used, for example, one obtained by dispersing a light-reflective substance in a light-transmissive resin. Suitable examples of the light-reflective substance include titanium oxide, silicon dioxide, zirconium dioxide, potassium titanate, aluminum oxide, aluminum nitride, boron nitride, and mullite. For example, a granular, fibrous, or thin plate-shaped light-reflective substance can be used, and particularly, a fibrous light-reflective substance is preferable due to an expectable effect that the coefficient of thermal expansion of the covering member is reduced.

As described above, some embodiments according to the present invention have been exemplified. The present invention, however, is not limited to the embodiments described above, and it is needless to say that any variations are included unless they deviate from the spirit of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a light emitting device, comprising:
   providing a light emitting element including an electrode-formed surface on which an electrode of the light emitting element is provided, a substrate surface opposite to the electrode-formed surface, and a light emitting surface connecting the electrode-formed surface and the substrate surface;
   providing a bottom mold including a mounting surface having a protrusion and mold recesses provided on both sides of the protrusion to define the protrusion;
   mounting the light emitting element on the protrusion such that the light emitting surface faces the protrusion;
   providing a covering material on the mounting surface of the bottom mold to fill the mold recesses and to cover an entirety of the light emitting element except for the light emitting surface;
   removing the bottom mold with the protrusion to provide a recess in the covering material, the light emitting surface constituting a bottom of the recess; and
   providing a light-transmissive material in the recess of the covering material.

2. The method according to claim 1, further comprising: disposing a light guiding material on the protrusion before the light emitting element is mounted on the protrusion.

3. The method according to claim 1, further comprising: mounting the light emitting element on a sheet,
   wherein the light emitting element is mounted on the protrusion via the sheet interposed between the light emitting element and the bottom mold.

4. The method according to claim 3, wherein the bottom mold includes a through hole for suctioning the sheet.

5. The method according to claim 1, wherein the light-transmissive material contains a wavelength conversion material.

* * * * *